(12) United States Patent
Kwon et al.

(10) Patent No.: US 9,702,948 B2
(45) Date of Patent: Jul. 11, 2017

(54) MAGNETIC RESONANCE IMAGING SYSTEM INCLUDING RADIO FREQUENCY COIL

(71) Applicant: Samsung Electronics Co., Ltd., Gyeonggi-do (KR)

(72) Inventors: Oh-soo Kwon, Seoul (KR); Ju-hyung Lee, Gyeonggi-do (KR); Man-ho Jeong, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 538 days.

(21) Appl. No.: 14/279,662

(22) Filed: May 16, 2014

(65) Prior Publication Data

US 2015/0061674 A1  Mar. 5, 2015

(30) Foreign Application Priority Data

Sep. 5, 2013  (KR) .................. 10-2013-0106823

(51) Int. Cl.
| | | |
|---|---|---|
| *G01R 33/34* | (2006.01) | |
| *G01R 33/341* | (2006.01) | |
| *G01R 33/345* | (2006.01) | |

(52) U.S. Cl.
CPC ...... *G01R 33/34007* (2013.01); *G01R 33/341* (2013.01); *G01R 33/3453* (2013.01); *G01R 33/34076* (2013.01); *Y10T 29/49018* (2015.01)

(58) Field of Classification Search
CPC ........ G01R 33/34007; G01R 33/34076; G01R 33/341; G01R 33/3453; Y10T 29/49018
See application file for complete search history.

(56) References Cited

U.S. PATENT DOCUMENTS

| | | | | |
|---|---|---|---|---|
| 5,664,568 | A * | 9/1997 | Srinivasan | G01R 33/3657 324/318 |
| 5,783,943 | A * | 7/1998 | Mastandrea, Jr. | G01R 33/385 324/318 |
| 5,990,681 | A * | 11/1999 | Richard | G01R 33/34046 324/318 |
| 6,618,610 | B2 | 9/2003 | Nabetani | |
| 8,022,706 | B2 | 9/2011 | Ham et al. | |
| 2013/0221966 | A1 | 8/2013 | Zhu et al. | |

FOREIGN PATENT DOCUMENTS

| | | |
|---|---|---|
| JP | 07-039539 A | 2/1995 |
| JP | 2001-276015 A | 10/2001 |
| JP | 2009-022640 A | 2/2009 |
| JP | 2013-128857 A | 7/2013 |

* cited by examiner

*Primary Examiner* — G. M. Hyder
(74) *Attorney, Agent, or Firm* — Cha & Reiter, LLC

(57) ABSTRACT

A magnetic resonance imaging (MRI) system comprises, a main magnet, a gradient coil and an RF coil. The main magnet generates a static magnetic field, the gradient coil which is formed inside the main magnet and generates a gradient magnetic field and the RF coil. The RF coil is formed inside the gradient coil and comprises a plurality of different components including: a former supporting the plurality of different components including windings and having a first area and a second area and a groove formed in the second area and in which a component of the RF coil is installed and inset, reducing thickness of the RF coil.

17 Claims, 4 Drawing Sheets

MAGNETIC RESONANCE IMAGING SYSTEM INCLUDING RADIO FREQUENCY COIL

CLAIM OF PRIORITY

This application claims the benefit of Korean Patent Application No. 10-2013-0106823, filed on Sep. 5, 2013, in the Korean Intellectual Property Office, the disclosure of which is incorporated herein in its entirety by reference.

BACKGROUND

1. Technical Field

A system concerns magnetic resonance imaging (MRI) involving a radio frequency (RF) coil.

2. Description of the Related Art

Known MRI systems acquire anatomical cross-section images of an object using light and dark contrast in expressing luminance intensity of a magnetic resonance (MR) signal derived from an RF echo signal generated in a magnetic field of a particular strength. For example, when an RF signal causing a particular nucleus (e.g., a hydrogen nucleus) to resonate is applied to an object positioned inside of a strong magnetic field for a predetermined time period, an echo MR signal is emitted from the particular nucleus used by the MRI system to derive an MR image. The MR signal comprises an RF signal radiated from the object and the magnitude of the MR signal may be determined in response to relaxation time T1, and relaxation time T2 of predetermined atoms (e.g., hydrogen) included in the object in blood flow, for example.

The MRI system may acquire an MR image by applying a magnetic field to an object lying on a table conveyed into an MRI apparatus. The table is used as a means for conveying an object into the bore of the MRI apparatus.

SUMMARY

A magnetic resonance imaging (MRI) system includes a radio frequency (RF) coil having a structure in which components may be installed so that the MRI system has a reduced overall thickness.

A magnetic resonance imaging (MRI) system comprises, a main magnet, a gradient coil and an RF coil. The main magnet generates a static magnetic field, the gradient coil which is formed inside the main magnet and generates a gradient magnetic field and the RF coil. The RF coil is formed inside the gradient coil and comprises a plurality of different components including: a former supporting the plurality of different components including windings and having a first area and a second area and a groove formed in the second area and in which a component of the RF coil is installed and inset, reducing thickness of the RF coil.

In a feature the RF coil element is formed on the second area, and the plurality of different components of the RF coil includes at least one of, a capacitor and a cable, inset into the groove to reduce thickness of the RF coil. The thickness of the first area is greater than a thickness of the second area, and a sum of the thickness of the second area and a thickness of the RF coil element is compatible with the thickness of the first area. The sum of the thickness of the second area and the thickness of the RF coil element deviates by about 10% or less from the thickness of the first area. The groove is formed with a depth selected in response to a thickness of the component installed in the groove. The depth of the groove deviates by about 10% or less from the thickness of the installed component. A thickness of the second area is formed to be greater than a depth of a deepest groove of grooves formed in the second area of the former, and a difference between the thickness of the second area and the depth of the deepest groove is between zero and five millimeters.

In another feature, the groove has a shape corresponding to a shape of the component of the RF coil and the former is formed of fiber reinforced plastics (FRP). The RF coil element is formed of copper foil, stainless steel, a printed circuit board (PCB), or a flexible PCB (FPCB) and comprises a first RF coil element which forms a loop shape and a second RF coil element formed in a linear shape. The first RF coil elements are formed in a plurality of patterns, and the capacitor is formed between the plurality of patterns of the first RF coil elements. Also signals are transmitted to and received from the RF coil through the cable, and the cable (e.g. a coaxial cable) has a structure in which a conductive substance is coated with an insulating substance.

In yet another feature, a method provides a magnetic resonance imaging (MRI) system including a radio frequency (RF) coil. The method incorporates within an MRI device assembly, a main magnet for generating a static magnetic field, a gradient coil within the main magnet, the gradient coil generating a gradient magnetic field and incorporates the RF coil within the gradient coil. The RF coil comprises a plurality of different components including, a former supporting the plurality of different components including windings and having a first area and a second area and a groove which is formed in the second area and in which a component of the RF coil is installed and inset, reducing thickness of the RF coil. An RF coil element is formed on the second area wherein the plurality of different components of the RF coil includes at least one of, a capacitor and a cable, inset into the groove to reduce thickness of the RF coil. A thickness of the first area is greater than a thickness of the second area, and the method selects a sum of the thickness of the second area and a thickness of the RF coil element to be compatible with the thickness of the first area. An RF coil winding element is formed on the second area so the thickness of the RF coil at the first area is compatible with the thickness of the RF coil at the first area. An RF coil winding element and a capacitor is formed on the second area so the thickness of the RF coil at the first area is compatible with the thickness of the RF coil at the first area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
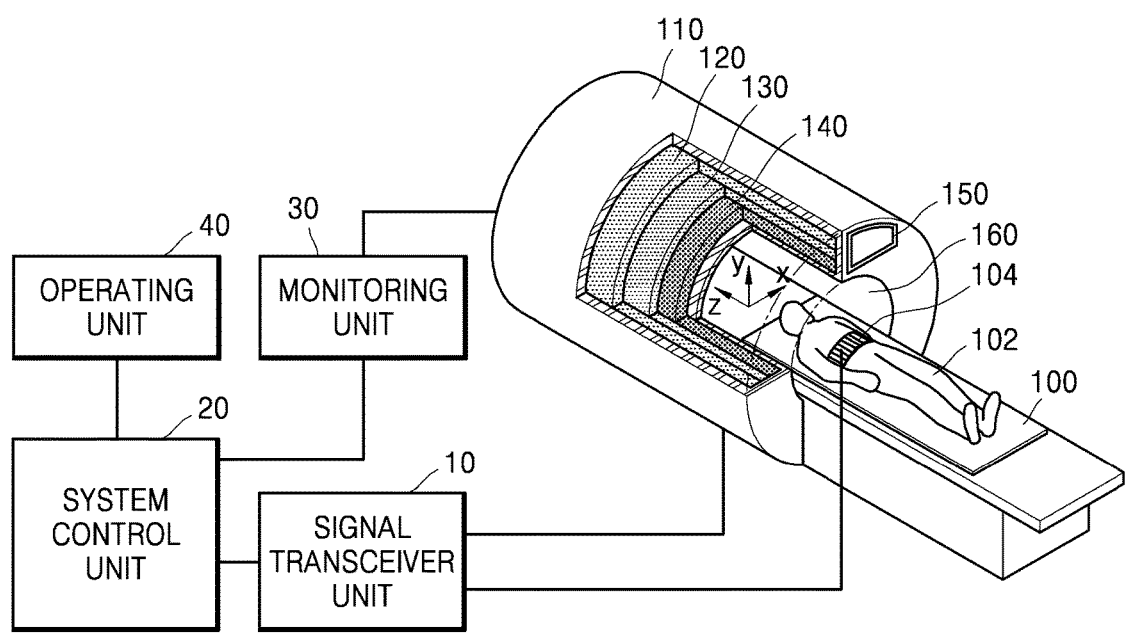
FIG. 1 shows a magnetic resonance imaging (MRI) system according to invention principles.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 schematically shows a magnetic resonance imaging (MRI) system including a chamber including a main magnet 120, a gradient coil 130, and a radio frequency (RF) coil 140. The main magnet 120 may generate a static magnetic field for directionally aligning the magnetic dipole moment of nuclei of elements causing magnetic resonance (MR), for example, hydrogen, phosphorus, sodium, within an object 102. An "object" may include a human or an animal, or a body part of a human or an animal. For example, an object may include an organ, such as a liver, heart, uterus, brain, breast, abdomen, or a blood vessel. Also, an "object" may include a phantom. A phantom comprises a substance having a density of living matter and a volume that is close to an effective atomic number of a living thing, and may include a spherical phantom having properties similar to those of the human body.

Main magnet 120 may comprise a superconducting magnet or a permanent magnet. A superconducting magnet may be used to generate a magnetic field of, for example, 0.5 T or more. An accurate MR image of the object 102 may be obtained when a magnetic field generated by the main magnet 120 is strong and uniform. Further, main magnet 120 may have a cylindrical shape. Gradient coil 130 may be installed inside of the main magnet 120. The gradient coil 130 may include three gradient coils that generate gradient magnetic fields in orthogonal directions of an x-axis, a y-axis, and a z-axis. Gradient coil 130 may generate a gradient magnetic field which is spatially-linear to acquire an MR image. The gradient coil 130 may provide position information about respective parts of the object 102 by inducing resonant frequencies differently according to the respective parts of the object 102.

The RF coil 140 may be installed inside the gradient coil 130, and may constitute a part of a cylindrical magnetic structure together with the main magnet 120 and the gradient coil 130. The RF coil 140 is a device capable of generating a high-frequency magnetic field having the Larmor frequency as a center frequency, and may apply an RF signal to the object 102 and receive an echo MR signal emitted from the object 102. For example, to excite a nucleus from a low-energy state to a high-energy state, the RF coil 140 may generate and apply an RF electromagnetic wave signal (RF signal) having a frequency corresponding to a type of the nucleus. When the electromagnetic wave signal generated by the RF coil 140 is applied the nucleus, the nucleus may transition from a low-energy state to a high-energy state and in response to signal termination, the nucleus may radiate electromagnetic waves having the Larmor frequency while transitioning from the high-energy state to the low-energy state. In response to termination of the electromagnetic wave signal, an energy level transition from high energy to low energy occurs, and an electromagnetic wave having the Larmor frequency may be radiated. The RF coil 140 may receive electromagnetic waves radiated from nuclei within the object 102. The RF coil 140 may have a form which is fixed in the chamber 110, or attachable to and detachable from the chamber 110. To diagnose a part of the object 102, an RF coil 104 may be further formed to be installable on the table 100 or attachable to and detachable from the table 100. The RF coil 104 may be an RF coil for a part of the object 102 including a head, neck, shoulder, chest, wrist, leg, ankle, of the object 102.

The chamber 110 including the main magnet 120, the gradient coil 130, and the RF coil 140 may have a cylindrical shape. Chamber 110 has a bore 160 into which the table 100 and object 102 are conveyed. The bore 160 may be formed in a z direction, and a diameter of the bore 160 may be determined according to sizes of the main magnet 120, the gradient coil 130, and the RF coil 140. The RF coil 140 may include various components, and a thickness of the RF coil 140 may be determined according to sizes and arrangement of the components. The diameter of the bore 160 may vary according to the thickness of the RF coil 140. The system advantageously in an embodiment, reduces thickness of the RF coil by optimizing the arrangement of the components of the RF coil 140 to obtain a desired diameter of the bore 160.

Outside the chamber 110 of the MRI system, a display 150 is installed and inside the chamber 110, an additional display may be further included. Through the displays positioned inside and outside the chamber 110, it is possible to deliver information to a user or the object 102. In addition, the MRI system may include a signal transceiver unit 10, a system control unit 20, a monitoring unit 30, and an operating unit 40. The signal transceiver unit 10 may control a gradient magnetic field formed inside the chamber 110, in response to an MR pulse sequence, and control transmission and reception of an RF signal and an MR signal. The system control unit 20 may control a sequence of signals formed within the chamber 110. The monitoring unit 30 may monitor and control the chamber 110 and instruments installed in the chamber 110. The operating unit 40 may command the system control unit 20 to control a pulse sequence and may control operation of the overall MRI system at the same time. The object 102 may be imaged when the object 102 positioned on the table 100 is moved into the bore 102, that is, in a z-axis direction, while the table is moving or stationary.

Figure 2:
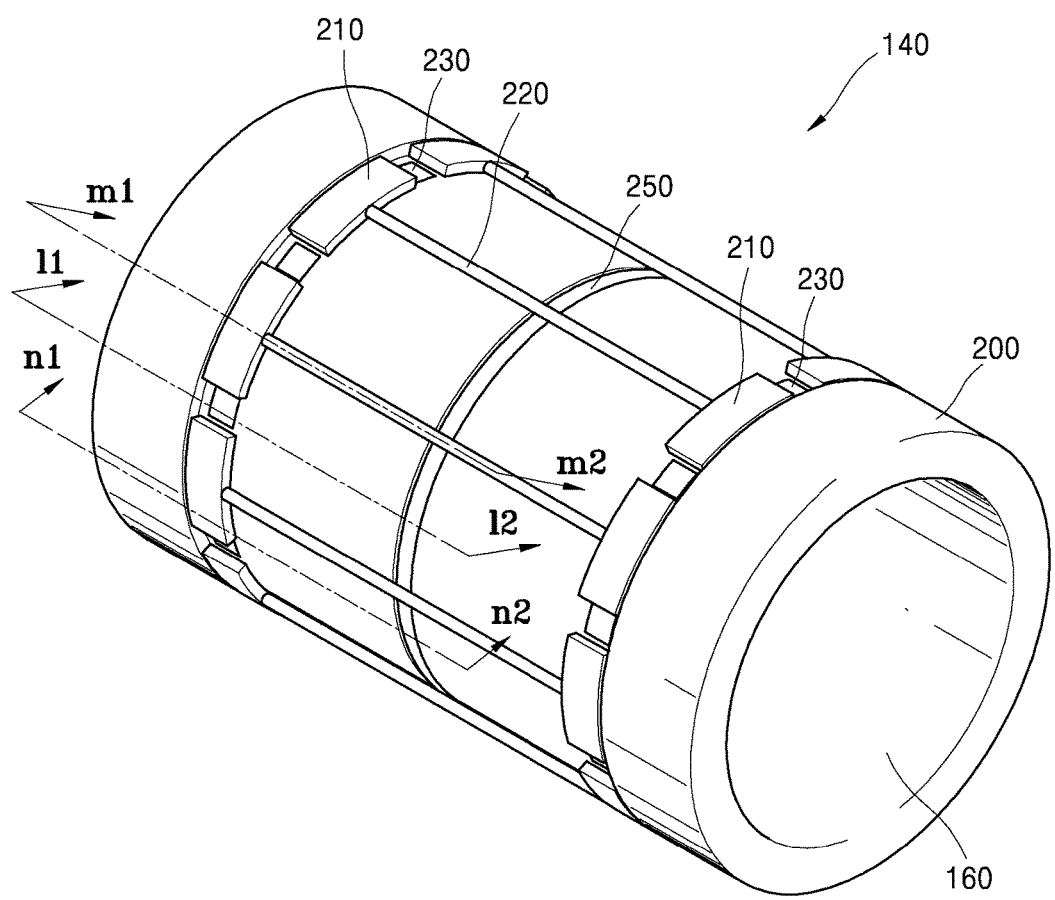
FIG. 2 shows a radio frequency (RF) coil of an MRI system according to invention principles.

FIG. 2 shows a radio frequency (RF) coil 140 of an MRI system including components comprising former 200, RF coil elements 210 and 220, a cable 250, a capacitor 230 and a diode. The former 200 corresponds to the exterior of the RF coil 140, and may also be referred to as an RF coil body or an RF coil base. The former 200 may be formed of a material providing enough rigidity so that the object 102 is not affected by vibration occurring from the gradient coil 130 or other components. The former 200 may be formed of a substance that is lightweight and has good corrosion resistance and formability. For example, the former 200 may be formed of fiber reinforced plastics (FRP), and may be formed of glass fiber reinforced plastics (GFRP).

The RF coil elements 210 and 220 may be formed of a conductive substance, and may be formed as a combination of conductive patterns of different shapes. The RF coil elements 210 and 220 may be referred to as antennas. In FIG. 2, the RF coil elements 210 and 220 may include first RF coil elements 210 forming a loop shape together, and second RF coil elements 220 formed in a linear shape in the z-axis direction. The RF coil elements 210 and 220 may be formed of a conductive substance, and may be formed of, for example, copper foil, stainless steel, a printed circuit board (PCB), or a flexible PCB (FPCB). The cable 250 enables signals to be transmitted to and received from the RF coil 140, and may have a structure in which a conductive substance is coated with an insulating substance. The cable 250 may be, for example, a coaxial cable. The capacitor 230 may be formed between the RF coil elements 210 and 220, and between the first RF coil elements 210 forming the loop shape. The capacitor 230 may be a multilayer ceramic capacitor (MLCC), but is not limited to the MLCC. Although the RF coil elements 210 and 220 form a birdcage coil in FIG. 2, the RF coil elements 210 and 220 may form other shapes including a surface coil or a transverse electromagnetic (TEM) coil. The thickness of the RF coil 140 of an MRI system is advantageously optimized by forming grooves that have shapes corresponding to different components on a surface of the former 200.

Figure 3:
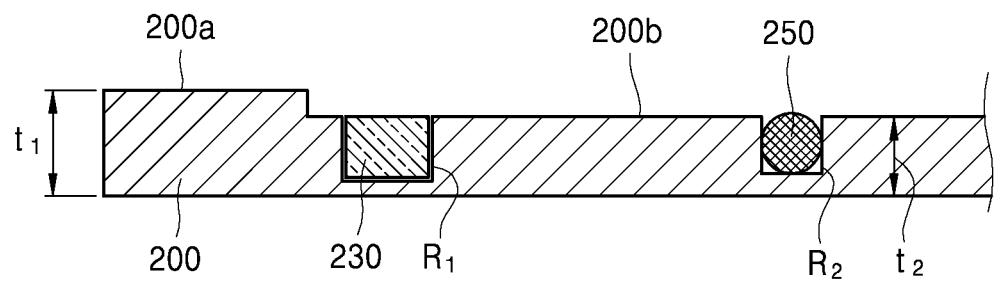
FIG. 3 is a cross-sectional view of the RF coil of FIG. 2 taken along line l1-l2 according to invention principles.

FIG. 3 shows a cross-sectional view of the RF coil of FIG. 2 taken along line l1-l2. Referring to FIGS. 2 and 3, the former 200 of the RF coil 140 may have a first area 200a and a second area 200b having a smaller thickness than the first area 200a. A thickness of the first area 200a of the former 200 may be t1, and that of the second area 200b may be t2. A difference between the thickness t1 of the first area 200a and the thickness t2 of the second area 200b in the former 200 may be determined in response to a thickness of the RF coil element 210 or 220. In the second area 200b of the RF coil 140, the components of the RF coil 140 may be installed, including, for example, the RF coil elements 210 and 220, the cable 250, the capacitor 230 and the diode. The installation of the components of the RF coil 140 may be the same in FIG. 4 and FIG. 5.

The capacitor 230 may be inserted and installed in a first groove R1 having a shape corresponding to a shape of the capacitor 230 formed in the former 200, and the cable 250 may be inserted and installed in a second groove R2 having a shape corresponding to a shape of the cable 250. However, the shapes of the grooves R1 and R2 formed in the second area 200b of the former 200 need not be identical to those of the components of the RF coil 140. For example, even when the cable 250 has a circular cross section, the second groove R2 may have a circular cross section or a polygonal cross section. When the components of the RF coil 140 are installed in the grooves R1 and R2 of the former 200, some of the components may protrude from a surface of the second area 200b, or the components may be completely inserted in the grooves R1 and R2. Thicknesses of components installed in the second area 200b of the former 200 of the RF coil 140 may be the same as, or similar to, depths of the corresponding grooves R1 and R2. For example, the depths of the grooves R1 and R2 formed in the second area 200b of the former 200 of the RF coil 140 may deviate by about 10% or less from the thicknesses of the installed components.

Figure 4:
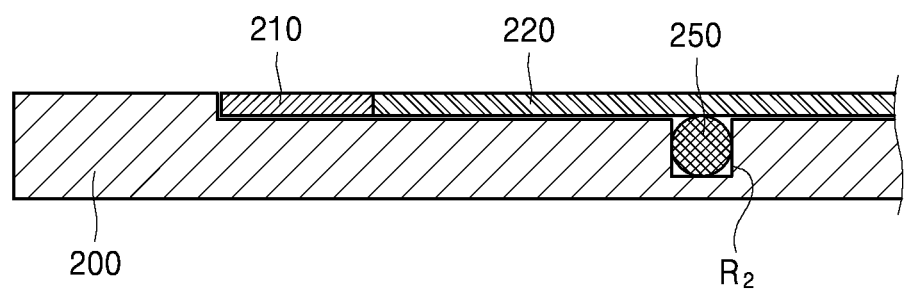
FIG. 4 is a cross-sectional view of the RF coil of FIG. 2 taken along line m1-m2 according to invention principles.

FIG. 4 shows a cross-sectional view of the RF coil of FIG. 2 taken along line m1-m2. Referring to FIGS. 2 to 4, the RF coil elements 210 and 220 may be positioned on an upper surface of the second area 200b of the former 200, and the second groove R2 in which the cable 250 may be installed is provided under the second RF coil element 220 so that the cable 250 may be embedded. As described above, the thickness of the first area 200a of the former 200 may be t1, that of the second area 200b of the former 200 may be t2, and the difference between the thickness t1 of the first area 200a and the thickness t2 of the second area 200b in the former 200 may correspond to the thickness of the RF coil elements 210 and 220. The sum of the thickness of the second area 200b of the former 200 and the thickness of the RF coil element 210 or 220 may be the same as or similar to the thickness t1 of the first area 200a of the former 200, and may deviate by about 10% or less from the thickness t1 of the first area 200a of the former 200.

Figure 5:
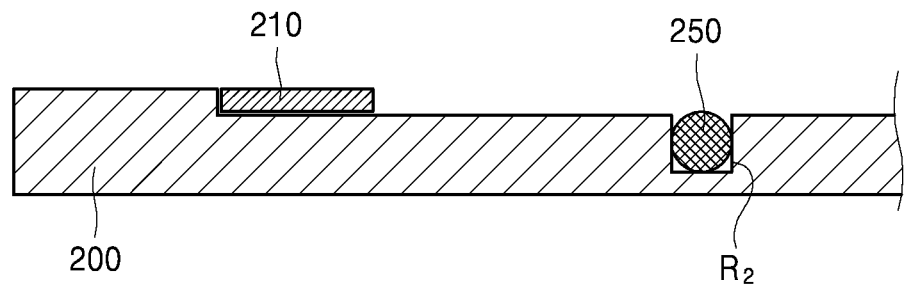
FIG. 5 is a cross-sectional view of the RF coil of FIG. 2 taken along line n1-n2 according to invention principles.

FIG. 5 shows a cross-sectional view of the RF coil of FIG. 2 taken along line n1-n2. Referring to FIGS. 2 to 5, the first RF coil elements 210 forming a loop shape may be formed on the second area 200b of the former 200, and the second groove R2 is provided so that the cable 250 may be installed. In the former 200 of the RF coil 140, the thickness t1 of the first area 200a and the thickness t2 of the second area 200b may be determined in response to thicknesses of the components of the RF coil 140. In particular, the thickness of the second area 200b in which the components are installed may be determined in response to thicknesses of the components other than the RF coil elements 210 and 220 including, for example, the capacitor 230, the cable 250 and the diode. The depths of the grooves R1 and R2 may be determined based on the thicknesses of these other components. The thickness of the second area 200b of the former 200 may be formed to be greater than a depth of the deepest groove of grooves R1 and R2. Former 200 advantageously reduces thickness of the RF coil 140. The thickness t2 of the second area 200b may be formed to be greater than the depth of the deepest groove of grooves R1 and R2, and the difference between the thickness t2 of the second area 200b and the depth of the deepest groove may be several millimeters or less (for example, 0-5 millimeters).

Figure 6:
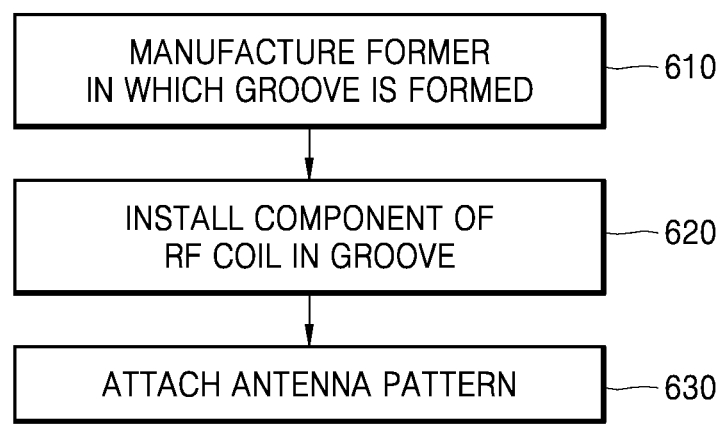
FIG. 6 shows a flowchart of a process of manufacturing an RF coil of an MRI system according to invention principles.

FIG. 6 shows a flowchart of a process for manufacturing an RF coil of an MRI system. Referring to FIGS. 2 to 6, the former 200 in which the grooves R1 and R2 are formed is fabricated (operation 610). The former 200 may be formed of a substance that is lightweight and has good corrosion resistance and formability. For example, the former 200 may be formed of FRP. The former 200 may be shaped to include the grooves R1 and R2 in the former 200. Alternatively, the former 200 may be shaped to have the first area 200a and the second area 200b, and the plurality of grooves R1 and R2 may be formed in the second area 200b of the former 200. The thickness t2 of the second area 200b of the former 200 may be formed to be greater than that of the thickest component among installed components. For example, the thickness t2 of the second area 200b of the former 200 may be formed to be greater than that of the thickest of the installed components by a thickness that is greater than about 0 and equal to or less than about 5 millimeters. The sum of the thickness t2 of the second area 200b of the former 200 and the thickness of the RF coil elements 210 and 220 may be the same as or similar to the thickness t1 of the first area 200a of the former 200. For example, the former 200 may be formed so that the sum of the thickness t2 of the second area 200b of the former 200 and the thickness of the RF coil element 210 or 220 may deviate by about 10% or less from the thickness t1 of the first area 200a of the former 200 (t1*0.9≤t2+thickness of RF coil element≤t1*1.1).

The components of the RF coil 140 may be installed (operation 620) in the grooves R1 and R2 formed in the former 200. Also, the RF coil elements 210 and 220 or an antenna pattern may be attached to a surface of the second area 200b of the former 200 (operation 630). The components of the RF coil 140, that is, the capacitor 230, the cable 250, may be installed in the grooves R1 and R2 of the second area 200b of the former 200, and the RF coil elements 210 and 220 may also be formed on the second area 200b. Although the RF coil elements 210 and 220 are components of the RF coil 140, the components installed in step 620 may include other components excluding the RF coil elements 210 and 220, such as the capacitor 230, the cable 250 and the diode. An installation order of each of the components of the RF coil 140 and the RF coil elements 210 and 220 may be selectively determined in response to respective positions thereof in the former 200. The thickness of the former 200 may be adjusted by controlling the installation positions of components of the RF coil 140 to be compatible with the diameter of the bore 160 in a chamber of an MRI system.

The system advantageously provides grooves corresponding to components of the RF coil in a former of an RF coil to facilitate installation. Further, by installing the components of the RF coil in the grooves formed in the former, the thickness of the RF coil may be reduced to be compatible with the diameter of a bore of an MRI apparatus.

Descriptions of features or aspects within each embodiment should typically be considered as available for other similar features or aspects in other embodiments.

While one or more embodiments of the present invention have been described with reference to the figures, it will be understood by those of ordinary skill in the art that different changes in form and details may be made therein without departing from the spirit and scope of the system as defined by the following claims.

The above-described embodiments can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. The functions and process steps herein may be performed automatically or wholly or partially in response to user command. An activity (including a step) performed automatically is performed in response to executable instruction or device operation without user direct initiation of the activity. No claim element herein is to be construed under the provisions of 35 U.S.C. 112, sixth paragraph, unless the element is expressly recited using the phrase "means for."

What is claimed is:

1. A magnetic resonance imaging (MRI) system including a radio frequency (RF) coil, comprising:
    a main magnet which generates a static magnetic field;
    a gradient coil which is formed inside the main magnet and generates a gradient magnetic field; and
    the RF coil, which is formed inside the gradient coil, wherein the RF coil comprises:
        a former having a first area and a second area; and
        a groove which is formed in the second area and in which a component of the RF coil is installed,
        wherein a thickness of the first area is greater than a thickness of the second area, and
        wherein the thickness of the second area is formed to be greater than a depth of the groove formed in the second area of the former.

2. The MRI system of claim 1, further comprising an RF coil element which is formed on the second area, wherein the component of the RF coil includes at least one of, a capacitor and a cable.

3. The MRI system of claim 2, wherein a sum of the thickness of the second area and a thickness of the RF coil element is substantially equal to the thickness of the first area.

4. The MRI system of claim 3, wherein the sum of the thickness of the second area and the thickness of the RF coil element deviates by about 10% or less from the thickness of the first area.

5. The MRI system of claim 2, wherein a difference between the thickness of the second area and the depth of a deepest groove is greater than zero and equal to or less than five millimeters.

6. The MRI system of claim 2, wherein the RF coil element is formed of copper foil, stainless steel, a printed circuit board (PCB), or a flexible PCB (FPCB).

7. The MRI system of claim 2, wherein the RF coil element comprises:
    a first RF coil element which forms a loop shape; and
    a second RF coil element formed in a linear shape.

8. The MRI system of claim 7, wherein the first RF coil elements are formed in a plurality of patterns, and the capacitor is formed between the plurality of patterns of the first RF coil elements.

9. The MRI system of claim 2, wherein signals are transmitted to and received from the RF coil through the cable, and the cable has a structure in which a conductive substance is coated with an insulating substance.

10. The MRI system of claim 9, wherein the cable is a coaxial cable.

11. The MRI system of claim 1, wherein the groove is formed with a depth selected in response to a thickness of the component installed in the groove.

12. The MRI system of claim 11, wherein the depth of the groove deviates by about 10% or less from the thickness of the installed component.

13. The MRI system of claim 1, wherein the groove has a shape corresponding to a shape of the component of the RF coil.

14. The MRI system of claim 1, wherein the former is formed of fiber reinforced plastics (FRP).

15. A method for providing a magnetic resonance imaging (MRI) system including a radio frequency (RF) coil, comprising:
    incorporating within an MRI device assembly,
        a main magnet for generating a static magnetic field;
        a gradient coil within the main magnet, the gradient coil generating a gradient magnetic field; and
    incorporating within the gradient coil the RF coil, the RF coil including:
        a former having a first area and a second area; and
        a groove which is formed in the second area and in which a component of the RF coil is installed,
        wherein a thickness of the first area is greater than a thickness of the second area, and
        wherein the thickness of the second area is formed to be greater than a depth of the groove formed in the second area of the former.

16. The method according to claim 15, further comprising forming an RF coil element on the second area wherein the component of the RF coil includes at least one of, a capacitor and a cable.

17. The method according to claim 16, wherein a sum of the thickness of the second area and a thickness of the RF coil element is substantially equal to the thickness of the first area.

* * * * *